United States Patent [19]
Ogawa et al.

[11] Patent Number: 5,217,925
[45] Date of Patent: Jun. 8, 1993

[54] APPARATUS AND METHOD FOR CLEANING SEMICONDUCTOR WAFERS

[75] Inventors: Mitsuhiro Ogawa, Yao; Toshiki Ouno; Taizou Ejima, both of Fukuoka; Satoru Kotou, Amagasaki, all of Japan

[73] Assignees: Taiyo Sanso Co., Ltd., Osaka; Mitsubishi Denki Kabushiki Kaisha, Tokyo, both of Japan

[21] Appl. No.: 798,738

[22] Filed: Nov. 27, 1991

[30] Foreign Application Priority Data

Nov. 30, 1990 [JP] Japan .................. 2-337527

[51] Int. Cl.⁵ .................. H01L 21/304; H01L 21/306; B24C 3/32
[52] U.S. Cl. .................. 437/225; 29/25.01; 134/7; 51/413; 51/424; 51/436
[58] Field of Search ............... 437/225, 228, 229, 946, 437/10; 134/7, 25.4, 31, 38, 2, 902; 29/25.01; 51/413, 436, 424, 425

[56] References Cited

U.S. PATENT DOCUMENTS

| 4,820,650 | 4/1989 | Nagae et al. | 437/10 |
| 4,974,375 | 12/1990 | Tada et al. | 51/413 |
| 5,025,597 | 6/1991 | Tada et al. | 51/436 |
| 5,035,750 | 7/1991 | Tada et al. | 437/10 |
| 5,081,068 | 1/1992 | Endo et al. | 437/946 |
| 5,129,198 | 7/1992 | Kanno et al. | 51/410 |

FOREIGN PATENT DOCUMENTS

| 63-86438 | 4/1988 | Japan . |
| 3-8327 | 1/1991 | Japan . |
| 3-167826 | 7/1991 | Japan . |

*Primary Examiner*—Olik Chaudhuri
*Assistant Examiner*—Ourmazd S. Ojan
*Attorney, Agent, or Firm*—Leydig, Voit & Mayer

[57] ABSTRACT

In an apparatus and a method for cleaning semiconductor wafers, an exhaust chamber having a sub-outlet slows down the flow of frozen micro-particles and thus prevents rebounding of the particles toward the wafer. Therefore, dust or the like is kept away from a cleaned semiconductor wafer so that the semiconductor wafers are cleaned more thoroughly.

12 Claims, 4 Drawing Sheets

APPARATUS AND METHOD FOR CLEANING SEMICONDUCTOR WAFERS

BACKGROUND OF THE INVENTION

1. Field of the Invention

The present invention relates to an apparatus and a method for cleaning substrates such as glass or disk-substrates, and particularly for cleaning semiconductor wafers.

2. Description of the Related Art

FIG. 5 shows a schematic sectional view of a conventional apparatus for cleaning semiconductor wafers. In the drawing, an ice maker 1 for producing frozen micro-particles 4 is supplied with a refrigerant such as liquid nitrogen, and is connected with a spray nozzle 3 which sprays ultrapure water. The ice maker 1 is covered with a thermal insulator (not shown). In a cleaning chamber 10 where a semiconductor wafer or the like is cleaned, a semiconductor wafer 7 is held by a semiconductor-wafer holding arm 6. The semiconductor wafer 7 held by the arm 6 can be moved by a conveying means 8. The frozen micro-particles produced in the ice maker 1 are ejected as the semiconductor wafer 7 by an injection nozzle 5 which is provided inside the cleaning chamber 10. Driving means 13 for controlling the positions and angles of the injection nozzle 5 is also provided inside the cleaning chamber 10. An exhaust blower 9 for exhausting the chamber 10 is provided at a bottom portion of the chamber 10.

In the conventional apparatus constructed as above, the inside of the ice maker 1 is chilled by evaporation of liquid nitrogen 2 supplied therein. After it is sufficiently chilled, ultrapure water is sprayed therein by the spray nozzle 3, producing frozen micro-particles 4, which are sent together with the nitrogen gas to the injection nozzle 5, by the ejector effect. The injection nozzle 5 ejects a mixture of the ice particles and the nitrogen gas against the semiconductor wafer 7 held by the arm 6. In this way, both faces of the wafer 7 are cleaned.

Since the frozen micro-particles 4 are ejected together with the nitrogen gas, a carrier gas, the jet flow which strikes the inner wall of the chamber 10 rebounds upwards. To prevent this upward rebounding a downflow is caused by the air drawn in from the top portion of the chamber 10 which is exhausted by the exhaust blower 9 through the bottom thereof.

In such an apparatus, the cleaning chamber 10 must be rather large since the chamber 10 is designed to contain the injection nozzle 5 and the driving means 13. Also, the exhaust blower 9 is required to have a large displacement because the jet flow from the injection nozzle 5 has to be thoroughly drawn out into an exhaust duct (not shown). Therefore, the apparatus is inevitably large and has a substantial operating cost. When the displacement of the exhaust blower 9 is reduced, the jet flow is not sufficiently drawn into the exhaust duct and strikes the inner wall of the chamber 10, resulting in the upward reboundings. Dust carried in the turbulence may well land on the once-cleaned surfaces of the semiconductor wafer 7.

SUMMARY OF THE INVENTION

The object of the present invention is to solve the above problems by providing an apparatus and a method for cleaning semiconductor wafers, wherein the cleaning chamber prevents upward rebounding of the ice-particle jet flow, if upward rebounding occurs, preventing the particle, from reaching the semiconductor wafer and thus keeping dust carried in the jet flow away from the wafer, and wherein the chamber is relatively smaller so that a relatively small displacement exhaust blower is sufficient.

In order to achieve the above object, according to one aspect of the present invention, there is provided an apparatus for cleaning semiconductor wafers comprising: an ice maker for producing frozen micro-particles, substantially of ultrapure water; a cleaning chamber including a main outlet at a bottom portion thereof; holding means for holding the semiconductor wafer in the cleaning chamber; an injection nozzle for injecting the frozen micro-particles into the cleaning chamber towards the semiconductor wafer; an exhaust duct having a sub-outlet and connected to the cleaning chamber; and an exhaust blower connected to both the main outlet and the sub-outlet.

According to another aspect of the present invention, there is provided a method for cleaning a semiconductor wafer comprising the steps of: holding a semiconductor wafer at a high level inside a cleaning chamber which has a main outlet at a bottom portion thereof; pelting the semiconductor wafer with frozen micro particles produced by freezing substantially ultrapure water; and preventing the upward-rebounding of the jet flow caused by the injection of the frozen micro-particles and preventing dust or the like in the jet flow from reaching the water by reducing the speed of the jet flow in an exhaust chamber having a sub-outlet, thereby cleaning the semiconductor wafer better.

DESCRIPTION OF THE PREFERRED EMBODIMENTS

Figure 1:
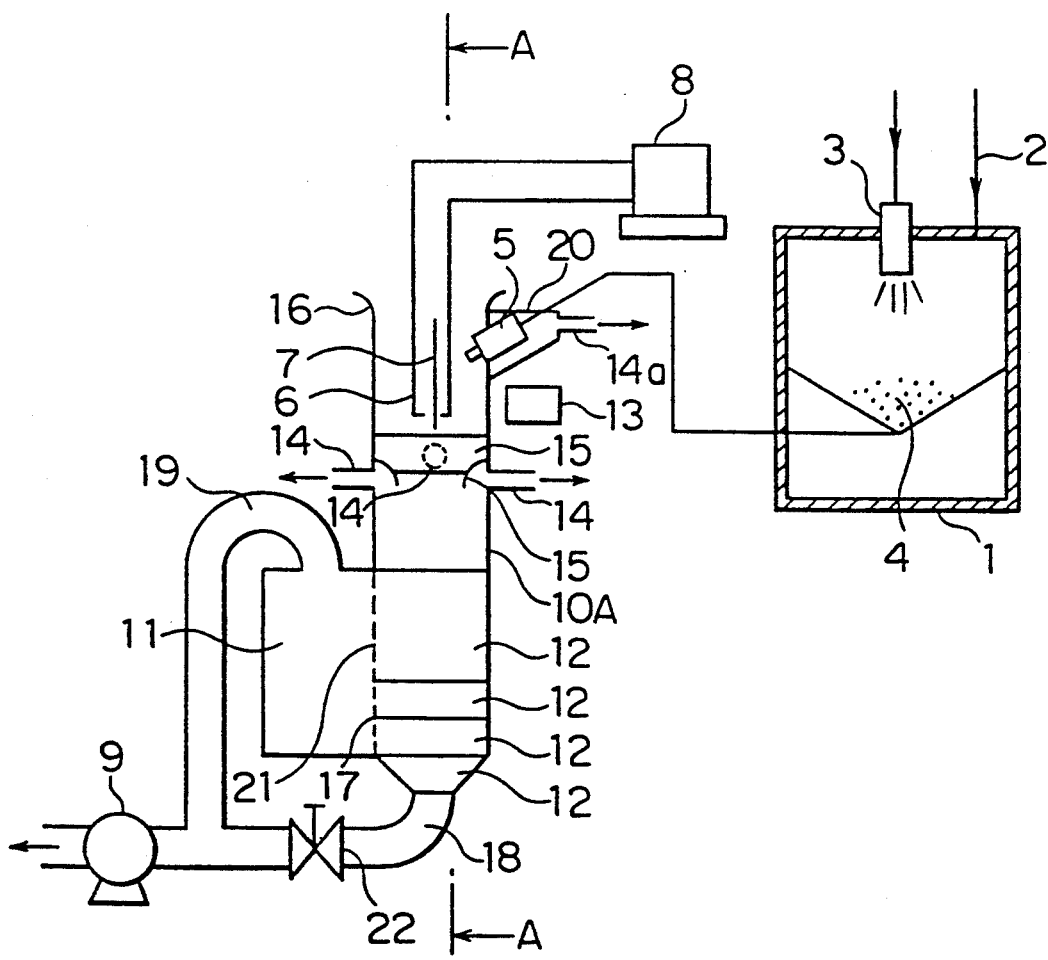
FIG. 1 is a schematic sectional view of an apparatus for cleaning semiconductor wafers according to one embodiment of the present invention.

FIG. 1 is a schematic sectional view of an apparatus for cleaning semiconductor wafers, according to one embodiment of the present invention. In the drawings, the members denoted by the same reference numerals are the same or equivalent members. A cleaning chamber 10A has a wide rectangular sectional-shape in order to house an object to be cleaned, such as a semiconductor wafer 7.

In the present invention, most portions of the injection nozzle 5, except for the tip portion, are mounted outside the cleaning chamber 10A, at the side thereof. A driving means 13 for the injection nozzle 5 is also placed outside the chamber 10A. The injection nozzle 5 is covered with a cover 20 which is provided with an outlet 14a. The chamber 10A has a bell shaped portion 16 at its top end. The mouth 16 prevents breaking off of ice formed on the surface of the top end portion of the chamber 10A.

Figure 2:
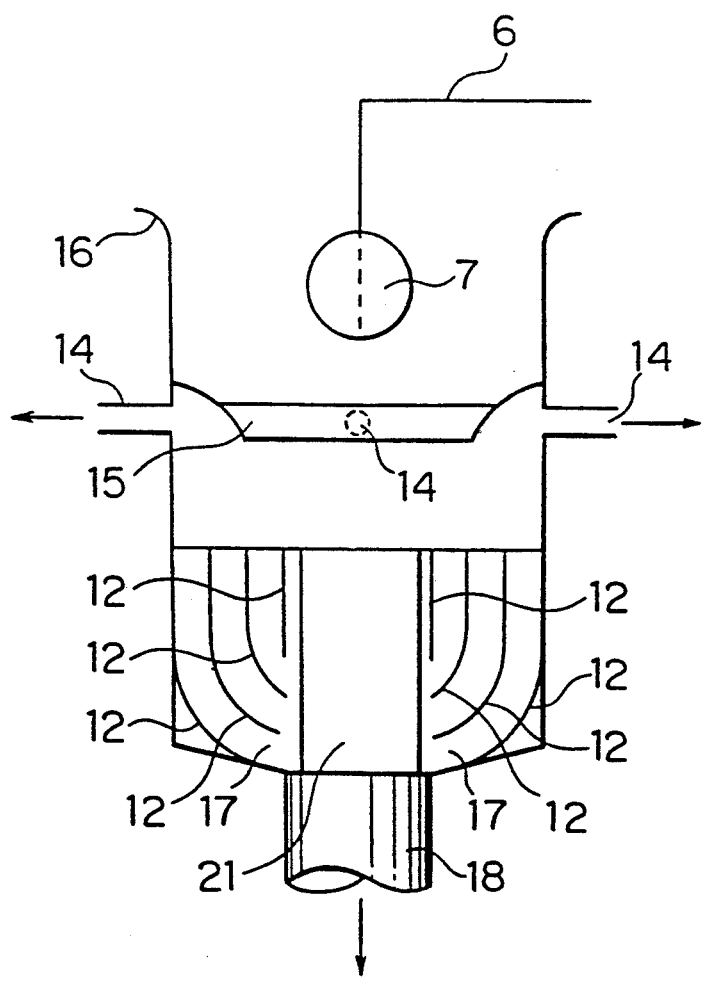
FIG. 2 is a schematic sectional view taken on line A—A of FIG. 1.
Figure 3:
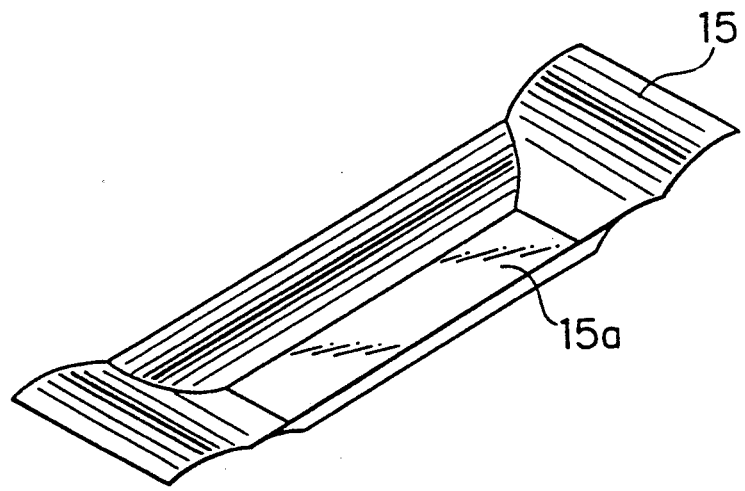
FIG. 3 is a perspective view of a current plate.

The cleaning chamber 10A contains a current plate 15 for preventing the upward-rebounding of the jet-flow from the injection nozzle 5. As shown in FIG. 3, the edges of the current plate 15 are curved and converged downwards, towards the center of the chamber 10A, the current plate has an opening 15a at its bottom portion. As shown in FIGS. 1 and 2, the side wall of the chamber 10A is provided with outlets 14, which are not provided in the current plate 15. In the chamber 10A, as shown in FIG. 2 illustrating a view taken on line A—A of FIG. 1, guide plates 12 for leading the jet-flow to the main outlet 18 are provided below the outlets 14.

Figure 4:
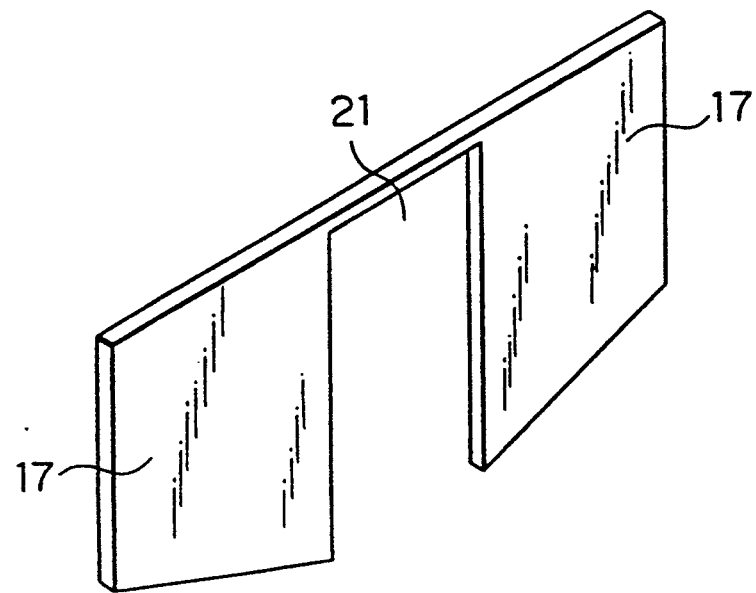
FIG. 4 is a perspective view of a divider.
Figure 5:
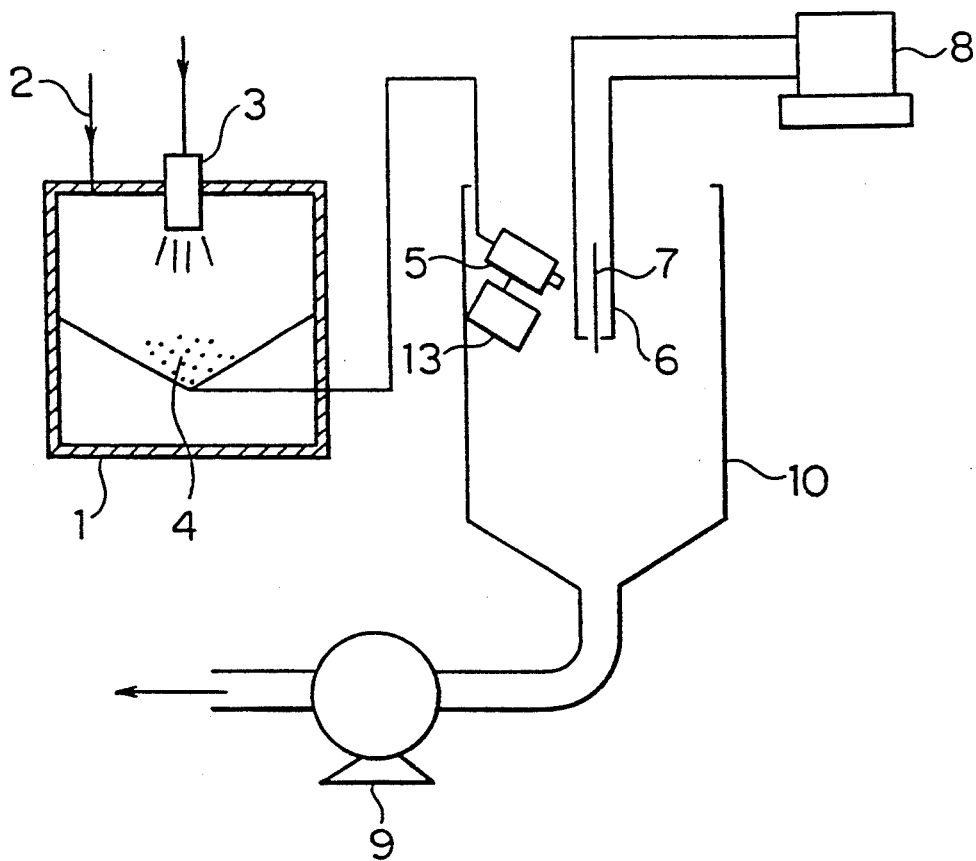
FIG. 5 is a schematic sectional view of a conventional apparatus for cleaning semiconductor wafers.

A lower portion of the cleaning chamber 10A is provided with an exhaust chamber 11 which slows down the jet flow caused by the injection of the frozen micro-particles (ice particles). A sub-outlet 19 is provided at the upper portion of the exhaust chamber 11. The exhaust chamber 11 is separated from the cleaning chamber 10A by a divider 17, shown in FIG. 4, which has an opening 21 at its central portion for connection between the two chambers 10A and 11. A main outlet 18 having a damper 22 is provided at the bottom portion of the cleaning chamber 10A. Both of the main and sub-outlets 18, 19 are connected to the exhaust blower 9.

In an apparatus constructed as above, the frozen micro-particles 4 are produced in the ice maker 1, and both surfaces of the semiconductor wafer 7 are cleaned by jetting the frozen micro-particles 4 from the injection nozzle 5 against the wafer 7.

Since the injection nozzle 5 and the means for driving the injection nozzle 13 are placed outside the cleaning chamber 10A, the chamber 10A can be reduced in size. Thus a smaller exhaust blower 9 can be employed, reducing the operating cost. Also, since the injection nozzle 5 is covered with the cover 20 having an outlet 14a, dust from the driving means 13 which may enter the cover 20 through the mechanical connection therebetween does not stay in the cover 20 and is drawn out through the outlet 14a. Thus, the dust from the driving means is unlikely to enter the chamber 10A and land on the semiconductor wafer 7.

Also, the mouth portion 16 at the top end of the cleaning chamber 10A prevents the breaking off of the ice which is formed on the top edge portion thereof, and thus helps provide a smooth down-flow. In other words, it helps prevent turbulence in the jet flow, such as upward rebounding, which has conventionally been likely to occur during injection of the ice particles. Therefore, dust or the like will not stay in the chamber 10A, nor land on the cleaned semiconductor wafer 7.

Further, the current plate 15 smoothly leads the jet flow of the injection down to a lower portion of the cleaning chamber 10A. Also, the current plate 15 stops the upward rebounding particles from going further up and leads the flow of the upward rebounding particles to spill out through the outlets 14. The main and sub-outlets 18 and 19, both provided at a lower portion of the chamber 10A, exhaust the chamber 10A. Thus, the upward rebounding which occurs when the jet flow from the injection nozzle 5 strikes a lower portion of the chamber 10A, is prevented or blocked. Therefore, there is little possibility that dust or the like carried by the upward rebounding of the jet flow will reach the cleaned semiconductor wafer 7.

Still further, a plurality of the guide plates 12, provided in a lower portion of the chamber 10A, smoothly direct the jet flow by injection to the main outlet 18, without causing reflection or break-away of the jet flow. Also, since the exhaust chamber 11 having the sub-outlet 19 thereon is provided at the side of the guide plates 12 and separated therefrom by the divider 17 having an opening 21, a part of the jet flow is slowly let out through the opening 21 into the exhaust chamber 11, so that the jet flow slows down and is efficiently drawn out through the main outlet 18 by the exhaust blower 9. By adjusting the displacement of the main outlet with the damper 22 previously, both a reducing function of the sub-outlet 19 and an exhaust from the main outlet 18 can be performed in good balance. The divider 17 keeps the flow in the exhaust chamber 11 from going back to the cleaning chamber 10A. The suction through the sub-outlet 19 also helps prevent upward rebounding because the suction force acts perpendicularly to the upward rebound in flow along the inner wall of the cleaning chamber 10A. At the opening 21, the upward rebounding along the inner wall does not occur.

As described above, an apparatus for cleaning semiconductor wafers, according to the present invention, is designed to provide a down-flow all through the cleaning chamber 10A and an efficient exhaust through the main and sub-outlets 18, 19 and to prevent the upward rebounding of the jet flow from reaching the semiconductor wafer 7. The cleaning chamber 10A can be made small so that even a small displacement of the exhaust can sufficiently prevent the upward rebounding which may well carry dust, from reaching the cleaned semiconductor wafer 7. Thus, semiconductor wafers can be cleaned more thoroughly in this invention than in the related art.

Though, in this embodiment, the cover 20 has an outlet 14, the cover 20 may be formed of a punched plate having holes. Such a cover can still be exhausted by a down flow in a clean room or the like, providing the same effect as in this embodiment.

In short, according to the present invention, semiconductor wafers can be cleaned more thoroughly than in the related art. This is because the exhaust chamber having the sub-outlet is provided beside a lower portion of the cleaning chamber with a connection therebetween so that the jet flow caused by the injection of the frozen micro-particles is slowed down and thus will not rebound upwards or, if it does, will not reach the semiconductor wafer. Also, the reduced size cleaning chamber and exhaust blower will reduce operating costs and the installation space of the apparatus.

What is claimed is:

1. An apparatus for cleaning semiconductor wafers comprising:
   an ice maker for producing frozen micro-particles;
   a cleaning chamber having a bottom portion including a main outlet;
   a holding means for holding a semiconductor wafer in said cleaning chamber;
   an injection nozzle for injecting said frozen micro-particles into said cleaning chamber towards a semiconductor wafer;
   an exhaust duct having a sub-outlet and connected to said main outlet of said cleaning chamber; and
   an exhaust blower connected to both said main outlet and said sub-outlet.

2. An apparatus according to claim 1 wherein said apparatus comprises driving means for driving said injection nozzle, said injection nozzle and driving means being disposed outside said cleaning chamber with a tip of said injection nozzle disposed within said cleaning chamber.

3. An apparatus according to claim 2 including a cover covering said injection nozzle.

4. An apparatus according to claim 3 wherein said cover includes an outlet.

5. An apparatus according to claim 3 wherein said cover is a punched metal-plate.

6. An apparatus according to claim 1 wherein said cleaning chamber contains a current plate having a portion curved towards the center of said cleaning chamber.

7. An apparatus according to claim 6 wherein said main outlet of said cleaning chamber is located below said current plate.

8. An apparatus according to claim 1 wherein said cleaning chamber includes a bell-shaped mouth opposite said main outlet.

9. An apparatus according to claim 1 including a damper disposed in said main outlet.

10. An apparatus according to claim 1 wherein said cleaning chamber contains a guide plate for directing frozen micro-particles toward said main outlet.

11. An apparatus according to claim 1 including an exhaust chamber communicating with said cleaning chamber and a divider having an opening and separating said cleaning chamber from said exhaust chamber.

12. A method for cleaning a semiconductor wafer comprising:
    placing a semiconductor wafer at a position inside a cleaning chamber which has a main outlet below the position of the wafer;
    pelting the semiconductor wafer with frozen micro-particles produced by freezing water; and
    preventing the upward rebounding of the frozen micro-particles, dust, and the like by reducing the speed of the flow from the cleaning chamber to an exhaust chamber having a sub-outlet.

* * * * *